(12) United States Patent
Chen et al.

(10) Patent No.: US 6,233,172 B1
(45) Date of Patent: May 15, 2001

(54) MAGNETIC ELEMENT WITH DUAL MAGNETIC STATES AND FABRICATION METHOD THEREOF

(75) Inventors: Eugene Youjun Chen, Gilbert; Jon Michael Slaughter, Tempe; Mark Durlam, Chandler; Mark DeHerrera; Saied N. Tehrani, both of Tempe, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/464,807

(22) Filed: Dec. 17, 1999

(51) Int. Cl.[7] .................................................. G11C 11/15
(52) U.S. Cl. ........................................ 365/173; 365/158
(58) Field of Search ..................................... 365/171, 158, 365/173

(56) References Cited

U.S. PATENT DOCUMENTS

| 5,801,984 | * | 9/1998 | Parkin | 365/158 |
| 5,828,598 | * | 10/1998 | Chen et al. | 365/173 |
| 5,898,612 | * | 4/1999 | Chen et al. | 365/158 |
| 5,959,880 | * | 9/1999 | Shi et al. | 365/173 |

* cited by examiner

*Primary Examiner*—Son T. Dinh
(74) *Attorney, Agent, or Firm*—William E. Koch

(57) ABSTRACT

An improved and novel magnetic element (10; 10'; 50; 50'; 80) including a plurality of thin film layers wherein the bit end magneto-static demagnetizing fields cancel the total positive coupling of the structure to obtain dual magnetic states in a zero external field. Additionally disclosed is a method of fabricating a magnetic element (10) by providing a plurality of thin film layers wherein the bit end magneto-static demagnetizing fields of the thin film layers cancel the total positive coupling of the structure to obtain dual magnetic states in a zero external field.

19 Claims, 2 Drawing Sheets

MAGNETIC ELEMENT WITH DUAL MAGNETIC STATES AND FABRICATION METHOD THEREOF

FIELD OF THE INVENTION

The present invention relates to magnetic elements for information storage and/or sensing and a fabricating method thereof, and more particularly, to a magnetic element and a method of fabricating a magnetic element with dual magnetic states.

BACKGROUND OF THE INVENTION

This application is related to a co-pending application that bears Motorola docket number CR 97-133 and U.S. Ser. No. 09/144,686, entitled "MAGNETIC RANDOM ACCESS MEMORY AND FABRICATING METHOD THEREOF," filed on Aug. 31, 1998, assigned to the same assignee and incorporated herein by this reference, co-pending application that bears Motorola docket number CR 97-158 and U.S. Ser. No. 08/986,764, entitled "PROCESS OF PATTERNING MAGNETIC FILMS" filed on Dec. 8, 1997, assigned to the same assignee and incorporated herein by this reference, copending application that bears Motorola docket number CR 99-001 and U.S. Ser. No. 09/356,864, entitled "MAGNETIC ELEMENT WITH IMPROVED FIELD RESPONSE AND FABRICATING METHOD THEREOF", filed Jul. 19, 1999, assigned to the same assignee and incorporated herein by this reference and issued U.S. Pat. No. 5,768,181, entitled "MAGNETIC DEVICE HAVING MULTI-LAYER WITH INSULATING AND CONDUCTIVE LAYERS", issued Jun. 16, 1998, assigned to the same assignee and incorporated herein by.

Typically, a magnetic memory element, such as a magnetic tunnel junction memory element, has a structure that includes ferromagnetic layers separated by a non-magnetic spacer layer. Information is stored as directions of magnetization vectors in the magnetic layers. Magnetic vectors in one magnetic layer, for instance, are magnetically fixed or pinned in the operating magnetic field range, while the magnetization direction of the other magnetic layer is free to switch between the same and opposite directions that are called "parallel" and "antiparallel" states, respectively. In response to parallel and antiparallel states, the magnetic memory element represents two different resistances. The resistance has minimum and maximum values when the magnetization vectors of the two magnetic layers point in substantially the same and opposite directions, respectively. Accordingly, a detection of change in resistance allows a device, such as an MRAM device, to provide information stored in the magnetic memory element. The difference between the minimum and maximum resistance values, divided by the minimum resistance is known as the magnetoresistance ratio (MR).

A MRAM device integrates magnetic elements, more particularly magnetic memory elements, and other circuits, for example, a control circuit for magnetic memory elements, comparators for detecting states in a magnetic memory element, input/output circuits, etc. These circuits are fabricated in the process of CMOS (complementary metal-oxide semiconductor) technology in order to lower the power consumption of the device.

In addition, magnetic elements structurally include very thin layers, some of which are tens of angstroms thick. The resistance versus magnetic field response of the magnetic elements is affected by the surface morphology of the thin layers. In order for a magnetic element to operate as a memory cell, it needs to have at least two resistance states when it is at resting state, or, when there is no magnetic field applied to it. This requirement on the magnetic elements is equivalent to having a nearly centered resistance versus magnetic field response. The presence of topological positive coupling and pin-hole coupling must be corrected to yield centered resistance.

During typical MTJ magnetic element fabrication, such as MRAM memory element fabrication, which includes metal films grown by sputter deposition, evaporation, or epitaxy techniques, the film surfaces are not absolutely flat but instead exhibit surface or interface waviness. This waviness of the surfaces and/or interfaces of the ferromagnetic layers is the cause of magnetic coupling between the free ferromagnetic layer and the other ferromagnetic layers, such as the fixed layer or pinned layer, which is known as topological coupling or Neel's orange peel coupling. Such coupling is typically undesirable in magnetic elements because it creates an offset in the response of the free layer to an external magnetic field. In addition, during typical spin valve magnetic element fabrication, electronic exchange coupling is present. Compensation for this type of coupling, as well as the presence of any other coupling effects commonly found in MTJ and spin valve elements must be compensated for to produce a centered resistance, and thus operation of the device in dual states.

Further, two kinds of offset in MRAM memory cell switching fields are commonly present. The first kind, as previously discussed, is the ferromagnetic coupling or positive coupling and is caused by topology-related magneto-static coupling and results in only the low resistance memory state being present at zero applied field. The memory cell in effect does not work. At least two memory states are required at zero field for the memory to function. The other kind of cell switching offset is called anti ferromagnetic coupling or negative coupling. It is caused by magneto-static coupling at the ends of the memory cell with cell length to width ratio of equal or greater than 1. Its effect is to have only the high resistance memory state present at zero applied field. Again the memory does not work without a reading magnetic field applied. It is preferable to perform the reading without applying a magnetic field caused by current pulse(s) to save power and achieve high speed.

Therefore, it is necessary to produce a device that includes bit end magneto-static fringing fields that cancel the total positive coupling of the structure, thus achieving dual magnetic states in a zero external field.

It is said that the ferromagnetic coupling strength is proportional to surface magnetic charge density and is defined as the inverse of an exponential of the interlayer thickness. As disclosed in U.S. Pat. No. 5,764,567, issued Jun. 9, 1998, and entitled "MAGNETIC TUNNEL JUNCTION DEVICE WITH NONFERROMAGNETIC INTERFACE LAYER FOR IMPROVED MAGNETIC FIELD RESPONSE", by adding a non-magnetic copper layer next to the aluminum oxide tunnel barrier in a magnetic tunnel junction structure, hence increasing the separation between the magnetic layers, reduced ferromagnetic orange peel coupling, or topological coupling, is achieved. However, the addition of the copper layer will lower the MR of the tunnel junction, and thus degrade device performance. In addition, the inclusion of the copper layer will increase the complexity for etching the material.

Accordingly, it is a purpose of the present invention to provide an improved magnetic element having centered resistance response curve with respect to an applied magnetic field, thereby capable of operating in dual states.

It is another purpose of the present invention to provide an improved magnetic element that includes compensation for the existence of ferromagnetic coupling, more particularly ferromagnetic coupling of topological origin or exchange coupling.

It is still a further purpose of the present invention to provide for a magnetic element wherein the bit end demagnetizing fields cancel the total positive coupling of the structure to obtain dual magnetic states in a zero external field It is a still further purpose of the present invention to provide a method of forming a magnetic element having centered resistance versus field response, thereby capable of operating in dual states.

It is still a further purpose of the present invention to provide a method of forming a magnetic element having centered resistance versus field response which is amenable to high throughput manufacturing.

SUMMARY OF THE INVENTION

These needs and others are substantially met through provision of a magnetic element including a plurality of thin film layers wherein the bit end demagnetizing fields cancel the total positive coupling of the structure to obtain dual magnetic states in a zero external field. Additionally disclosed is a method of fabricating a magnetic element by providing a plurality of thin film layers wherein the bit end demagnetizing fields of the thin film layers cancel the total positive coupling of the structure to obtain dual magnetic states in a zero external field.

DETAILED DESCRIPTION OF THE PREFERRED EMBODIMENTS

Figure 1:
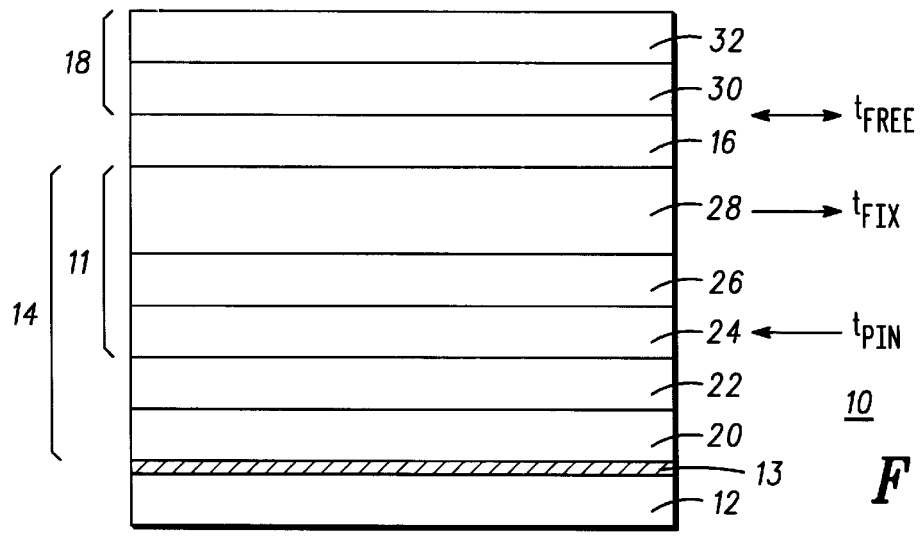
FIGS. 1–5 show cross-sectional views of a plurality of magnetic elements with improved field response according to the present invention.
Figure 2:
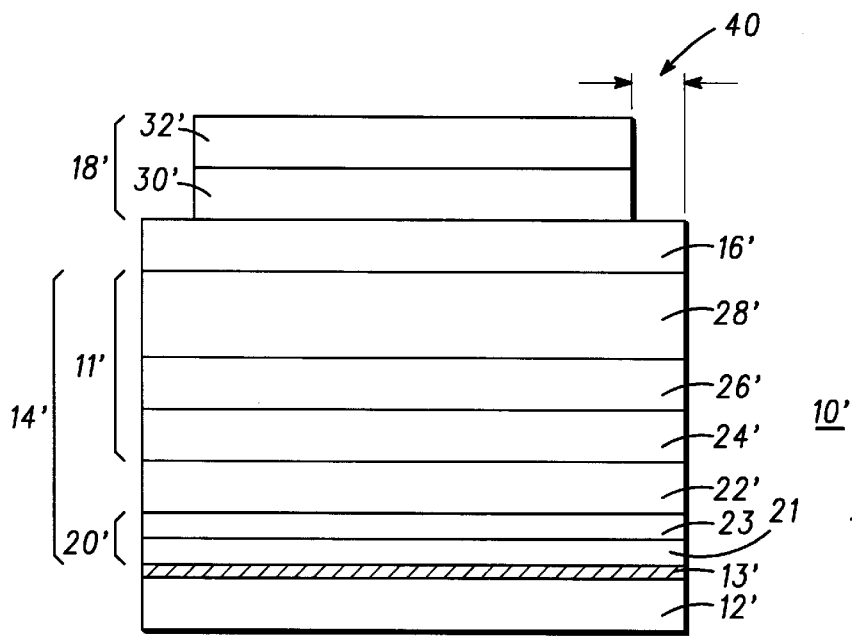

During the course of this description, like numbers are used to identify like elements according to the different figures that illustrate the invention. FIGS. 1 and 2 illustrate in cross-sectional views the structure of two embodiments of a MTJ magnetic element according to the present invention. More particularly, illustrated in FIG.1, is a fully patterned magnetic element structure 10, including a synthetic anti ferromagnetic structure 11. The structure includes a substrate 12, a base electrode multilayer stack 14, a spacer layer 16 including oxidized aluminum, and a top electrode multilayer stack 18. Base electrode multilayer stack 14 and top electrode multilayer stack 18 include ferromagnetic layers. Base electrode layers 14 are formed on a metal lead 13, which is formed on a substrate 12. Base electrode layers 14 include a plurality of bottom layers 20 which serve as a seed layer and a template layer, deposited on base metal lead 13, a layer of antiferromagnetic pinning material 22, a pinned ferromagnetic layer 24, an interlayer 26 of ruthenium, and a fixed ferromagnetic layer 28 formed on and exchange coupled with the underlying antiferromagnetic pinning layer 22.

Bottom layers 20 are typically formed of tantalum and ruthenium (Ta/Ru). These layers serve as an orienting base for antiferromagnetic pinning layer 22.

Antiferromagnetic pinning layer 22 is generally formed of iridium manganese (IrMn) or platinum manganese (PtMn).

Pinned ferromagnetic layer 24 is described as pinned, in that its magnetic moment is exchange coupled to the pinning layer 22 such that it is prevented from rotation in the presence of an applied magnetic field large enough to rotate the free magnetic layer 30. Ferromagnetic layer 24 is typically formed of alloys of one or more of the following: nickel (Ni), iron (Fe), and cobalt (Co). Next, interlayer 26, typically made of ruthenium, serves to induce antiferromagnetic exchange coupling between pinned ferromagnetic layer 24 and fixed ferromagnetic layer 28. Finally, fixed ferromagnetic layer 28 is formed on an uppermost surface of interlayer 26 of ruthenium. Fixed ferromagnetic layer 28 is described as fixed, or pinned, in that its magnetic moment is prevented from rotation in the presence of an applied magnetic field large enough to rotate the free magnetic layer 30.

Top electrode stack 18 includes a free ferromagnetic layer 30 and a protective layer 32. The magnetic moment of free ferromagnetic layer 30 is not fixed, or pinned, by exchange coupling, and is free to rotate between two states in the presence of an applied magnetic field. Free ferromagnetic layer 30 is typically formed of nickel iron (NiFe) alloy.

Fixed ferromagnetic layer 28 is described as having a thickness of $t_1$, wherein $t_1$, is typically within a range of 3–100 Å. Pinned ferromagnetic layer 24 is described as having a thickness of $t_2$, wherein t2 is generally less than 100 Å. Spacer layer 16 is described as having a thickness of $t_3$, wherein t3 is generally less than 50 Å for magnetic tunnel junction structures or spin valve type films with a copper (Cu) spacer. In this particular embodiment, to provide for the compensation of positive coupling across spacer layer 16, fixed ferromagnetic layer 28 is formed having a thickness that is greater than the thickness of pinned ferromagnetic layer 24, more specifically $t_1 > t_2$. It should be understood that a reversed, or flipped, structure is anticipated by this disclosure. More particularly, it is anticipated that the disclosed magnetic element can be formed to include a top fixed, or pinned layer, and thus described as a top pinned structure.

All magnetic layers can be a single magnetic material, or a composite magnetic layer made of multiple magnetic layers, next to each other for fine tuning its magnetic properties, such as switching field, magneto-resistance, etc. In this embodiment, fixed ferromagnetic layer 28 has properties of $M_1$ and $T_1$, where M=magnetization, and T=thickness, pinned ferromagnetic layer 24 has properties of $M_2$ and $T_2$, and free ferromagnetic layer 30 has properties $M_3$ and $T_3$.

To compensate for the positive topological coupling between the fixed ferromagnetic layer 28 and free ferromagnetic layer 30, the product of $M_1 T_1$ needs to be larger than $M_2 T_2$. This can be achieved by making $T_1 > T_2$ and $M_1 = M_2$ or by making $T_1 = T_2$ and $M_1 > M_2$, or by making $T_1 > T_2$ and $M_1 > M_2$. By adjusting the difference between $M_1$ and $T_1$, and $M_2 T_2$, the positive coupling can be totally cancelled. When $M_1 T_1 > M_2 T_2$, there will be uncompensated poles or magnetic charges at the ends of fixed ferromagnetic layer 28. In a high density memory cell with length/width ratio equal or greater than 1, magnetostatic coupling between the free ferromagnetic layer 30 and bit ends of the fixed and pinned ferromagnetic layers is antiferromagnetic in nature to form magnetic flux closure. This antiferromagnetic coupling can be tuned through the difference in $M_1T_1$, and $M_2T_2$ to fully cancel the positive coupling.

Illustrated in FIG. 2, is an alternative embodiment of a fully patterned magnetic element structure, referenced 10', including a synthetic antiferromagnetic structure 11'. Again, it should be noted that all components of the first embodiment that are similar to components of the second embodiment, are designated with similar numbers, having a prime added to indicate the different embodiment. Similar to the structure described with regard to FIG. 1, this structure includes a substrate 12', a base electrode multilayer stack 14', a spacer layer 16', and a top electrode multilayer stack 18'. Base electrode multilayer stack 14' and top electrode multilayer stack 18' include ferromagnetic layers, generally similar to stack 14 and 18 of FIG. 1. Base electrode layers 14' are formed on a metal lead 13', which is formed on a substrate 12' and includes a plurality of bottom layers 20', including a first seed layer 21, deposited on metal lead 13', and a template layer 23, a layer of antiferromagnetic material 22', a pinned ferromagnetic layer 24' formed on and exchange coupled with the underlying antiferromagnetic layer 22', a coupling interlayer 26', and a fixed ferromagnetic layer 28' which is antiferromagnetically coupled to the pinned layer. Ferromagnetic layer 24' and 28' are described as pinned, or fixed, in that their magnetic moment is prevented from rotation in the presence of an applied magnetic field. Top electrode stack 18' includes a free ferromagnetic layer 30' and a protective layer 32'. The magnetic moment of the free ferromagnetic layer 30' is not fixed, or pinned, by exchange coupling, and is free to rotate between two states in the presence of an applied magnetic field.

Fixed ferromagnetic layer 28' is described as having a thickness of $T_1$. Pinned ferromagnetic layer 24' is described as having a thickness of $T_2$. In this particular embodiment, to provide for the compensation of positive coupling across spacer layer 16', fixed ferromagnetic layer 28' is formed having a thickness that is greater than the thickness of pinned ferromagnetic layer 24', more specifically $T_1 > T_2$. It should be understood that a reversed, or flipped, structure is anticipated by this disclosure. More particularly, it is anticipated that the disclosed magnetic element with SAF structure can be formed to include a top fixed, or pinned layer, and thus described as a top pinned structure.

Fabrication of this particular embodiment involves two etching steps. Initially all layers are etched to define the magnetic device 10', and then protective layer 30' and free ferromagnetic layer 30' are etched to define an offset 40. More specifically, the layers below free ferromagnetic layer 30' are larger than free ferromagnetic layer 30' by an amount of offset 40. This etching of device 10' provides for the avoidance of shorting across spacer layer 16'.

Figure 3:
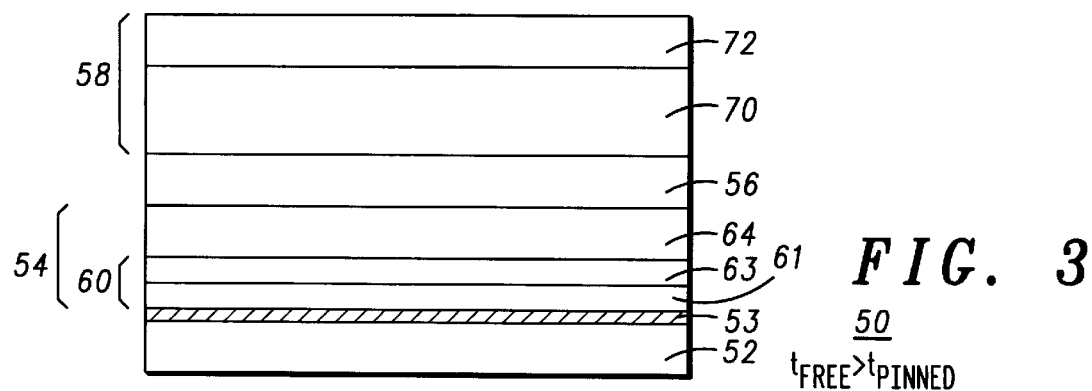

Referring now to FIG. 3, illustrated is a simplified cross-sectional view of another embodiment of the magnetic device of the present invention. More particularly, illustrated is device 50, generally similar to device 10 of FIG. 1, except in this particular embodiment, magnetic element 50 is formed without a coupling interlayer, and a fixed ferromagnetic layer. Similar to the structure described with regard to FIG. 1, this structure includes a substrate 52, a base electrode multilayer stack 54, a spacer layer 56, and a top electrode multilayer stack 58. Base electrode multilayer stack 54 and top electrode multilayer stack 58 include ferromagnetic layers, generally similar to stack 14 and 18 of FIG. 1. Base electrode layers 54 are formed on a metal lead 53, which is formed on a substrate 52 and includes a plurality of bottom layers 60, including a first seed layer 61, deposited on metal lead 53, and a template layer 63. Base electrode multilayer stack 54 further includes a pinned ferromagnetic layer 64. Ferromagnetic layer 64 is described as fixed, or pinned, in that its magnetic moment is prevented from rotation in the presence of an applied magnetic field below a certain strength. Top electrode stack 58 includes a free ferromagnetic layer 70 and a protective layer 72. The magnetic moment of the free ferromagnetic layer 70 is not fixed, or pinned, by exchange coupling, and is free to rotate between two states in the presence of an applied magnetic field above a certain strength.

Figure 4:
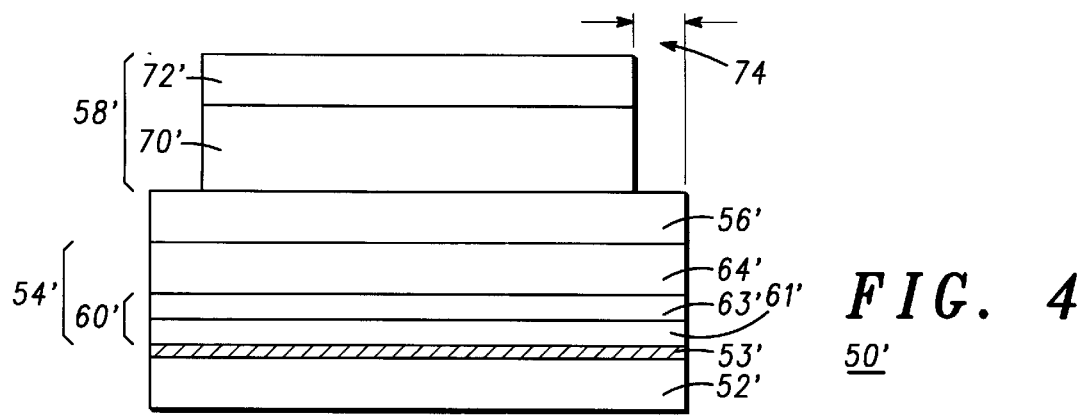

Generally similar to the embodiment illustrated in FIG. 2, device 50 can include an offset 74, as illustrated in FIG. 4. It should be understood that all components of the embodiment of FIG. 3 that are similar to components of the embodiment of FIG. 4, are designated with similar numbers, having a prime added to indicate the different embodiment.

In the embodiment illustrated in 4, offset 74 provides for a decrease in the demagnetizing field from pinned ferromagnetic layer 64' to free ferromagnetic layer 70' thereby canceling positive coupling between pinned ferromagnetic layer 64' and free ferromagnetic layer 70'. It should be understood that a reversed, or flipped, structure is anticipated by this disclosure. More particularly, it is anticipated that the disclosed magnetic element can be formed to include a top fixed, or pinned layer, and thus described as a top pinned structure.

Referring again to FIG. 4, fabrication of this particular embodiment, involves two etching steps. Initially all layers are etched to define the magnetic device 50', and then protective layer 72' and free ferromagnetic layer 70' are etched to define offset 74. More specifically, the layers below free ferromagnetic layer 70' are larger than free ferromagnetic layer 70' by an amount of offset 74. This etching of device 50' provides for the avoidance of shorting across spacer layer 56'.

Figure 5:
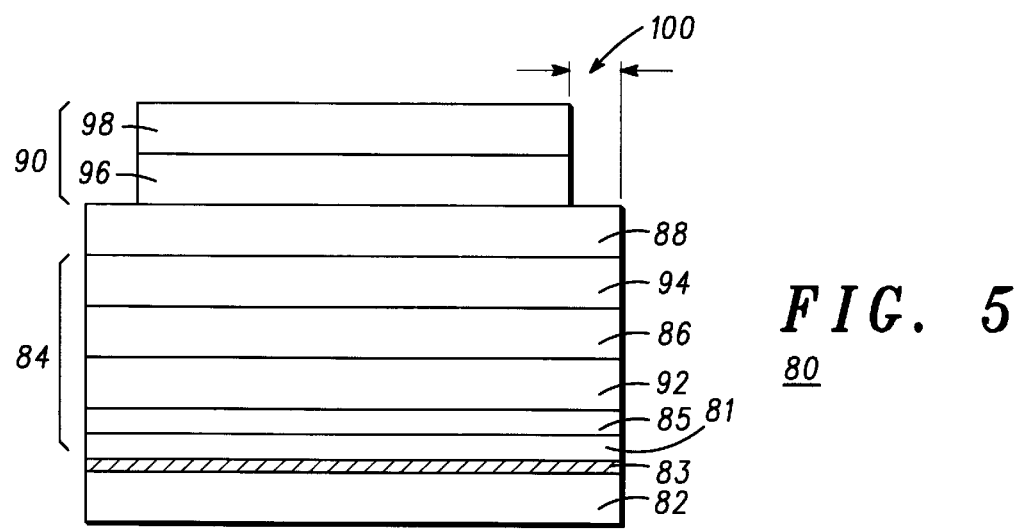

Referring now to FIG. 5, illustrated in simplified cross-sectional view is another embodiment of the magnetic element of the present invention. More particularly, illustrated is magnetic element 80, formed without a coupling interlayer, and a fixed ferromagnetic layer. Similar to the structure described with regard to FIG. 4, this structure includes a substrate 82, a base electrode multilayer stack 84, a first spacer layer 86, a second spacer layer, or tunnel barrier, 88 and a top electrode multilayer stack 90. Base electrode multilayer stack 84 and top electrode multilayer stack 90 include ferromagnetic layers, generally similar to stack 14 and 18 of FIG. 1. Base electrode layers 84 are formed on a base metal lead 83, which is formed on a substrate 82 and includes a plurality of bottom layers, including a first seed layer 81, deposited on base metal lead 83, and an optional template layer 85. Base electrode multilayer stack 84 further includes a ferromagnetic layer 92. Ferromagnetic layer 92 is described as fixed, or pinned, in that its magnetic moment is prevented from rotation in the presence of an applied magnetic field below a certain strength. Base electrode multilayer stack 84 additionally includes spacer layer 86, and a free ferromagnetic layer 94. The magnetic moment of free ferromagnetic layer 94 is not fixed, or pinned, by exchange coupling, and is free to rotate between two states in the presence of an applied magnetic field above a certain strength. Top electrode stack 90 includes a second fixed ferromagnetic layer 96 and a protective layer 98. Ferromagnetic layers 92 and 96 are described as having antiparallel alignment due to end-magneto static coupling.

Generally similar to the embodiment illustrated in FIG. 4, device 80 can optionally include an offset 100, as illustrated in FIG. 5. Offset 100 provides for a decrease in the demagnetizing field from at least one of the ferromagnetic layerS 92 or 96 to free ferromagnetic layer 94 thereby canceling positive coupling between the ferromagnetic layerS 92 or 96 and free ferromagnetic layer 96. It should be understood that a reversed, or flipped, structure is anticipated by this disclosure.

Fabrication of this particular embodiment, involves two etching steps when there is an offset 100. Initially all layers are etched to define the magnetic device 80, and then protective layer 98 and ferromagnetic layer 96 are etched to define offset 100. More specifically, the layers below ferromagnetic layer 96 are larger than pinned ferromagnetic layer 96 by an amount of offset. This etching of device 80 provides for the avoidance of shorting across spacer layer 88.

Figure 6:
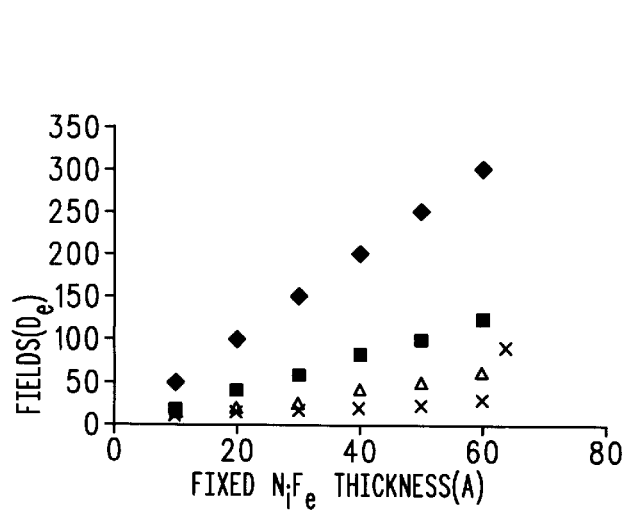
FIG. 6 illustrates the experimental results of the topological coupling field and the calculated demagnetization field versus the fixed magnetic layer thickness according to the present invention.

Referring now to FIG. 6, a diagrammatic illustration is provided showing the effect of the thickness of the fixed ferromagnetic layer, such as layer 28 of FIG. 1, relative to the topological coupling field ($H_{cpl}$) and bit-end demagnetizing field, or negative field, of the magnetic element. As illustrated, with an increase in the offset of the device layers, as illustrated in FIGS. 2 and 4, a decrease in the demagnetization field can be shown. An offset of less than 3000 Å results in a larger negative field, or demagnetizing field. Magnetic elements typically utilized in information storage and/or sensing devices necessitate the use of thin free layers to maintain low switching fields. Yet, when designing devices with these thin free layers, the topological coupling field $H_{cpl}$ is increased. Accordingly, to compensate, or cancel, the topological coupling field $H_{cpl}$, adjustments can be made in the remaining structure of the magnetic element as disclosed herein to compensate or cancel the positive coupling field, with the demagnetizing field.

Figure 7:
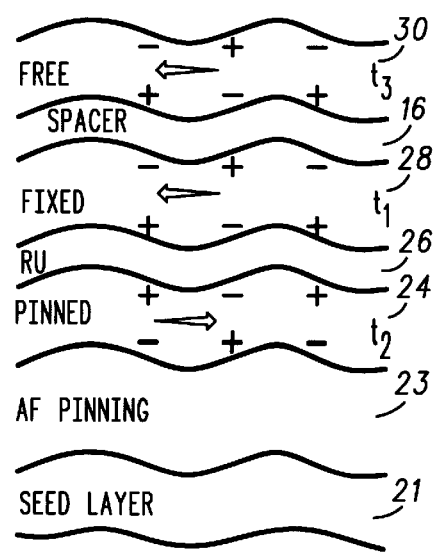
FIG. 7 illustrates the magnetic poles of the metal film layers of the magnetic element according to the present invention.

Referring to FIG. 7, illustrated is the reduction in the coupling field $H_{cpl}$ by adjusting the thickness of the magnetic layers, such as fixed layer 28 relative to pinned layer 24 of FIG. 1. As illustrated, by increasing the thickness of fixed layer 28 to be greater than the thickness of pinned layer 24, the existence of a positive coupling field $H_{cpl}$ is compensated for. The existence of positive end poles and opposing negative end poles cancels out the positive coupling, including topographical, pin-hole and positive electronic exchange coupling. Accordingly, and as illustrated in FIG. 7, a magnetic element, generally similar to magnetic element 10 of FIG. 1, having included in addition to free layer 30, a fixed layer 28 having a thickness greater than the thickness of pinned layer 24, will provide for a difference between layers 28 and 30 thereby offsetting the positive coupling and providing for centered resistance versus field response and a balanced device capable of operating in dual states.

Referring more specifically to FIG. 7, magnetic end poles are created between layers 24 and 28. By increasing the thickness of fixed layer 28 so that fixed layer 28 has a thickness greater than pinned layer 24, compensation of positive coupling can be achieved in magnetic element 10.

Next, it is disclosed that the use of non-magnetic seed and template layers, such as layers 61 and 63 of FIG. 3, will result in a decrease in the magnetic field response coupling without the need for the inclusion of a SAF structure. The template layer will add no moment to the structure, thus the only end magneto-static coupling is a result of the thin pinned layer included within the structure. Accordingly, adjustments can be made for the canceling of the level of coupling to a device capable of operating in dual states. When template layer 63 is nonmagnetic, and there is no SAF, negative magnetostatic coupling due to poles at the ends of the patterned shape are present, thus positive coupling can be controlled by the thickness of pinned layer 64 relative to free layer 70. The thickness of pinned layer 64 could be chosen to offset the magnetostatic coupling giving a centered loop. Thus, by decreasing the thickness of pinned layer 64 so that pinned layer 64 has a thickness smaller than pinned layer 70, the cancellation of positive coupling can be achieved in magnetic element 50.

Referring again to FIG. 7, illustrated is the structure of magnetic element 10 of FIG. 1 showing the magnetic poles wherein the bit end magneto-static demagnetizing fields cancel the total positive coupling of the structure to obtain dual magnetic states in a zero external field.

Thus, a magnetic element capable of operation in dual states and its fabrication method are disclosed in which the magnetic coupling is canceled, or compensated for based on the thickness or the product of magnetization and thickness of the plurality of magnetic layers relative to each other. As disclosed, this technique can be applied to devices using patterned magnetic elements, such as magnetic sensors, magnetic recording heads, magnetic recording media, or the like. Accordingly, such instances are intended to be covered by this disclosure.

What is claimed is:

1. A magnetic element comprising a plurality of thin film layers wherein a plurality of bit end magneto-static demagnetization fields cancel the total positive coupling of the magnetic element to obtain dual magnetic states in a zero external field.

2. A magnetic element as claimed in claim 1 wherein the plurality of thin film layers form one of a spin valve structure or a magnetic tunnel junction (MTJ) structure.

3. A magnetic element as claimed in claim 2 wherein the plurality of thin film layers form a SAF structure having a fixed ferromagnetic layer and a pinned ferromagnetic layer, the fixed ferromagnetic layer having a thickness greater than the pinned ferromagnetic layer thereby canceling positive coupling between the fixed ferromagnetic layer and a free ferromagnetic layer.

4. A magnetic element as claimed in claim 2 wherein the plurality of thin film layers form a structure including a plurality of ferromagnetic layers having differing switching fields, wherein an offset between the ferromagnetic layers provides for a decrease in the demagnetizing field between the ferromagnetic layers thereby canceling positive coupling between the ferromagnetic layers.

5. A magnetic element as claimed in claim 4 wherein the plurality of ferromagnetic layers include a pinned ferromagnetic layer and a free ferromagnetic layer, and the offset provides for a decrease in the demagnetizing field from the pinned ferromagnetic layer to the free ferromagnetic layer thereby canceling positive coupling between the pinned ferromagnetic layer and the free ferromagnetic layer.

6. A magnetic element as claimed in claim 2 wherein the plurality of thin film layers form a structure including a free ferromagnetic layer, a plurality of spacer layers, and a plurality of ferromagnetic layers having antiparallel alignment due to end-magneto static coupling, wherein the thickness of at least one of the plurality of ferromagnetic layers is adjusted to provide for the canceling of positive coupling between the free ferromagnetic layer and at least one of the plurality of ferromagnetic layers.

7. A magnetic element comprising:
a first electrode comprising a fixed ferromagnetic layer whose magnetization is fixed in a preferred direction in the presence of an applied magnetic field having a specific strength, the fixed ferromagnetic layer having a thickness$_1$ ($t_1$), a pinned ferromagnetic layer having a thickness$_2$ ($t_2$) and a coupling interlayer located between the fixed ferromagnetic layer and the pinned ferromagnetic layer;

a second electrode comprising a free ferromagnetic layer having a surface whose magnetization is free to rotate in the presence of a sufficient applied magnetic field;

a spacer layer located between the fixed ferromagnetic layer of the first electrode and the free ferromagnetic layer of the second electrode;

wherein the thickness $t_1$, of the fixed ferromagnetic layer is greater than the thickness $t_2$ of the pinned ferromagnetic layer thereby canceling positive coupling between the fixed ferromagnetic layer and the free ferromagnetic layer; and a substrate, the first and second electrodes, and the spacer layer, being formed on the substrate.

8. A magnetic element as claimed in claim 7 wherein the pinned ferromagnetic layer has its magnetization fixed by an antiferromagnetic pinning layer, and the fixed ferromagnetic layer is fixed in the opposite direction by antiferromagnetic exchange to the pinned ferromagnetic layer through a coupling interlayer, thereby defining a SAF structure.

9. A magnetic element as claimed in claim 7 wherein the coupling interlayer is formed of ruthenium (Ru).

10. A magnetic element as claimed in claim 7 further including at least one offset between the free ferromagnetic layer and the spacer layer.

11. A magnetic element as claimed in claim 7 wherein the spacer layer includes one of a dielectric material defining a MTJ structure or a conductive material defining a spin valve structure.

12. A magnetic element comprising:

a first electrode comprising a pinned ferromagnetic layer whose magnetic moment is pinned in a preferred direction in the presence of an applied magnetic field characterized as having a specific strength;

a second electrode comprising a free ferromagnetic layer having a surface whose magnetization is free to rotate in the presence of a sufficient applied magnetic field;

a spacer layer located between the pinned ferromagnetic layer of the first electrode and the free ferromagnetic layer of the second electrode;

wherein an offset provides for a decrease in the demagnetizing field from the pinned ferromagnetic layer to the free ferromagnetic layer thereby canceling positive coupling between the pinned ferromagnetic layer and the free ferromagnetic layer; and a substrate, the first and second electrodes, and the spacer layer, being formed on the substrate.

13. A magnetic element as claimed in claim 12 wherein the spacer layer includes one of a dielectric material defining a MTJ structure or a conductive material defining a spin valve structure.

14. A method of fabricating a magnetic element comprising the step of providing a plurality of thin film layers wherein a plurality of bit end magneto-static demagnetizing fields cancel the total positive coupling of the magnetic element to obtain dual magnetic states in a zero external field.

15. A method of fabricating a magnetic element as claimed in claim 14 wherein the step of providing a plurality of thin film layers includes the step of providing the plurality of thin film layers to form one of a spin valve structure or a magnetic tunnel junction (MTJ) structure.

16. A method of fabricating a magnetic element as claimed in claim 15 wherein the step of providing a plurality of thin film layers includes the step of forming a SAF structure having a fixed ferromagnetic layer and a pinned ferromagnetic layer, the fixed ferromagnetic layer having a thickness greater than the pinned ferromagnetic layer thereby canceling positive coupling between the fixed ferromagnetic layer and a free ferromagnetic layer.

17. A method of fabricating a magnetic element as claimed in claim 15 wherein the step of providing a plurality of thin film layers includes the step of forming a structure including a plurality of ferromagnetic layers having differing switching fields, wherein an offset between the ferromagnetic layers provides for a decrease in the demagnetizing field between the ferromagnetic layers thereby canceling positive coupling between the ferromagnetic layers.

18. A magnetic element as claimed in claim 17 wherein the step of providing a plurality of ferromagnetic layers includes the step of forming a pinned ferromagnetic layer and a free ferromagnetic layer, and the offset provides for a decrease in the demagnetizing field from the pinned ferromagnetic layer to the free ferromagnetic layer thereby canceling positive coupling between the pinned ferromagnetic layer and the free ferromagnetic layer.

19. A method of fabricating a magnetic element as claimed in claim 15 wherein the step of providing a plurality of thin film layers includes the step of forming a structure including a free ferromagnetic layer, a plurality of spacer layers, and a plurality of ferromagnetic layers having antiparallel alignment due to end-magneto static coupling, wherein the thickness of at least one of the plurality of ferromagnetic layers is adjusted to provide for the canceling of positive coupling between the free ferromagnetic layer and at least one of the plurality of ferromagnetic layers.

* * * * *

UNITED STATES PATENT AND TRADEMARK OFFICE
CERTIFICATE OF CORRECTION

PATENT NO.    : 6,233,172 B1
DATED         : May 15, 2001
INVENTOR(S)   : Chen et al.

It is certified that error appears in the above-identified patent and that said Letters Patent is hereby corrected as shown below:

<u>Column 4,</u>
Line 4, after the Title, please add the following paragraph:

-- This invention was made with Government support under Agreement No. MDA972-96-3-0016 awarded by DARPA. The Government has certain rights in the invention. --

Signed and Sealed this

Twenty-eighth Day of October, 2003

JAMES E. ROGAN
*Director of the United States Patent and Trademark Office*